United States Patent [19]
Takagi

[11] Patent Number: 6,087,880
[45] Date of Patent: Jul. 11, 2000

[54] LEVEL SHIFTER

[75] Inventor: Shunsuke Takagi, Nagano, Japan

[73] Assignee: Sony Corporation, Japan

[21] Appl. No.: 08/785,551

[22] Filed: Jan. 21, 1997

[30] Foreign Application Priority Data

Jan. 25, 1996 [JP] Japan .................................. 8-010834

[51] Int. Cl.[7] ............................................. H03K 19/0185
[52] U.S. Cl. .......................... 327/333; 327/437; 326/63; 326/68; 326/83
[58] Field of Search .................................... 327/333, 374, 327/382, 427, 437, 391; 326/63, 68, 83, 27

[56] References Cited

U.S. PATENT DOCUMENTS

| | | | |
|---|---|---|---|
| 4,910,416 | 3/1990 | Salcone ..................................... | 307/254 |
| 5,237,213 | 8/1993 | Tanoi ........................................ | 307/290 |
| 5,239,211 | 8/1993 | Jinbo ........................................ | 307/443 |
| 5,426,376 | 6/1995 | Wong et al. .............................. | 326/27 |
| 5,430,335 | 7/1995 | Tanoi ....................................... | 327/170 |
| 5,493,245 | 2/1996 | Kao et al. ................................ | 327/333 |

*Primary Examiner*—Timothy P. Callahan
*Assistant Examiner*—An T. Luu
*Attorney, Agent, or Firm*—Ronald P. Kananen; Rader, Fishman & Grauer

[57] ABSTRACT

A level shifter provided with a first inverter for shifting a high logic level of an input signal, a second inverter for shifting a low logic level of the input signal, a first output transistor for supplying a high voltage to an output terminal by an output voltage of the first inverter, and a second output transistor for supplying a low voltage to the output terminal by an output voltage of the second inverter which controls the supply of the high voltage of the first inverter and the supply of the low voltage of the second inverter so as to realize stable operation even with a low power supply voltage.

17 Claims, 12 Drawing Sheets

LEVEL SHIFTER

BACKGROUND OF THE INVENTION

1. Field of the Invention

The present invention relates to a level shifter for converting a level of an input signal to another level.

2. Description of the Related Art

Same flash electrically erasable programmable read only memories (EEPROM) and other semiconductor nonvolatile memories perform a write operation or a read operation by using a control signal set to a plus high voltage PV and a minus high voltage MV in addition to a power supply voltage Vcc level and a ground voltage GND level.

For this, such flash EEPROMs etc. are provided with a level shifter for converting the power supply voltage Vcc level or the ground GND level to the plus high voltage PV level or the minus high voltage MV level and outputting the converted signal.

In general, a level shifter is constituted by a separate circuit for converting the control signal to the plus high voltage and circuit for converting the control signal to the minus high voltage or by a latch circuit with inputs and outputs connected cross-wise and a transmission gate and transmitting the input signal to an input-output terminal through the transmission gate ad then boosting the power supply voltage of the latch circuit.

However, the former circuit becomes large in size, while with the latter circuit, it is necessary to configure the transmission gate by only an n-channel metal insulator semiconductor (MIS) transistor at the plus high voltage side and only a p-channel MIS transistor at the minus high voltage side in order to prevent the boosted voltage from flowing backward to an input terminal of the input signal. Due to this, in the case of a low power supply voltage, the voltage of the input signal will be affected by the threshold voltage of the transmission gate and, as a result, the signal will not be able to be transmitted. As a result, it becomes necessary to form a transistor with an especially low threshold voltage, which increases the cost of the production.

SUMMARY OF THE INVENTION

An object of the present invention is to provide a level shifter which can realize stable operation under a lower power supply voltage and does not need a special process of production and which further realizes a higher speed of operation.

According to a first aspect of the present invention, there is provided a level shifter comprising a first power supply terminal, a second power supply terminal, a signal input terminal supplied with an input signal set to a high logic level and a low logic level which are based on a potential of the first power supply terminal and a potential of the second power supply terminal, respectively, a high potential power supply terminal with a potential higher than the potential of the power supply terminal, a low potential power supply terminal with a potential lower than the potential of the second power supply terminal, first and second inverters with input terminals connected to the signal input terminal, a first transistor connecting an output terminal of the level shifter and the high potential power supply terminal upon the fall of an output potential of the first inverter, and a second transistor connecting the output terminal of the level shifter and the low potential power supply terminal upon the rise of an output potential of the second inverter, the first inverter supplied with a current from the high potential power supply terminal upon the fall of the potential of the output terminal of the level shifter, and the second inverter supplied with a current from the low potential power supply terminal upon the rise of the potential of the output terminal of the level shifter.

Preferably, the first inverter is constituted by a first current supply means for supplying a current at the time of a fall of the potential of the output terminal of the level shifter and a third transistor with a gate electrode connected to the signal input terminal, the first current supply means and the third transistor being connected in series between the high potential power supply terminal and the second power supply terminal and the output terminal being constituted by the connection point of the first current supply means and the third transistor, and the second inverter is constituted by a fourth transistor with a gate electrode connected to the signal input terminal and a second current supply means for supplying the current at the time of a rise of the potential of the output terminal of the level shifter, the fourth transistor and the second current supply means being connected in series between the first supply terminal and the low potential power supply terminal and the output terminal being constituted by the connection of the fourth transistor and the second current supply means.

Preferably, the first current supply means is constituted by a fifth transistor with an input terminal connected to the output terminal of the level shifter, and the second current supply means is constituted by a sixth transistor with an output terminal connected to the output terminal of the level shifter.

Alternatively, the first current supply means is constituted by a fifth transistor with an input terminal connected to the output terminal of the level shifter and a seventh transistor with an input terminal connected to the signal input terminal, the fifth and seventh transistors being connected in series, and the second current supply means is constituted by a sixth transistor with an input terminal connected to the output terminal of the level shifter and an eighth transistor with an input terminal connected to the signal input terminal, the sixth and eighth transistors being connected in series.

Preferably, the output of the first inverter is connected to one of the source-drain terminals of a ninth transistor which is cut-off by a voltage of the output terminal of the first inverter higher than the potential of the first power supply terminal, the output of the second inverter is connected to one of the source-drain terminals of a 10th transistor which is cut-off by a voltage of the output terminal of the second inverter lower than the potential of the second power supply terminal, and the other source-drain terminal of the ninth transistor and the other source-drain terminal of the 10th transistor are connected.

BRIEF DESCRIPTION OF THE DRAWINGS

These and other objects and features of the present invention will become more apparent from the following description of the preferred embodiments made with reference to the drawings, in which.

DESCRIPTION OF THE PREFERRED EMBODIMENTS

Preferred embodiments of the present invention will now be explained in further detail with reference to the drawings.

Figure 1:
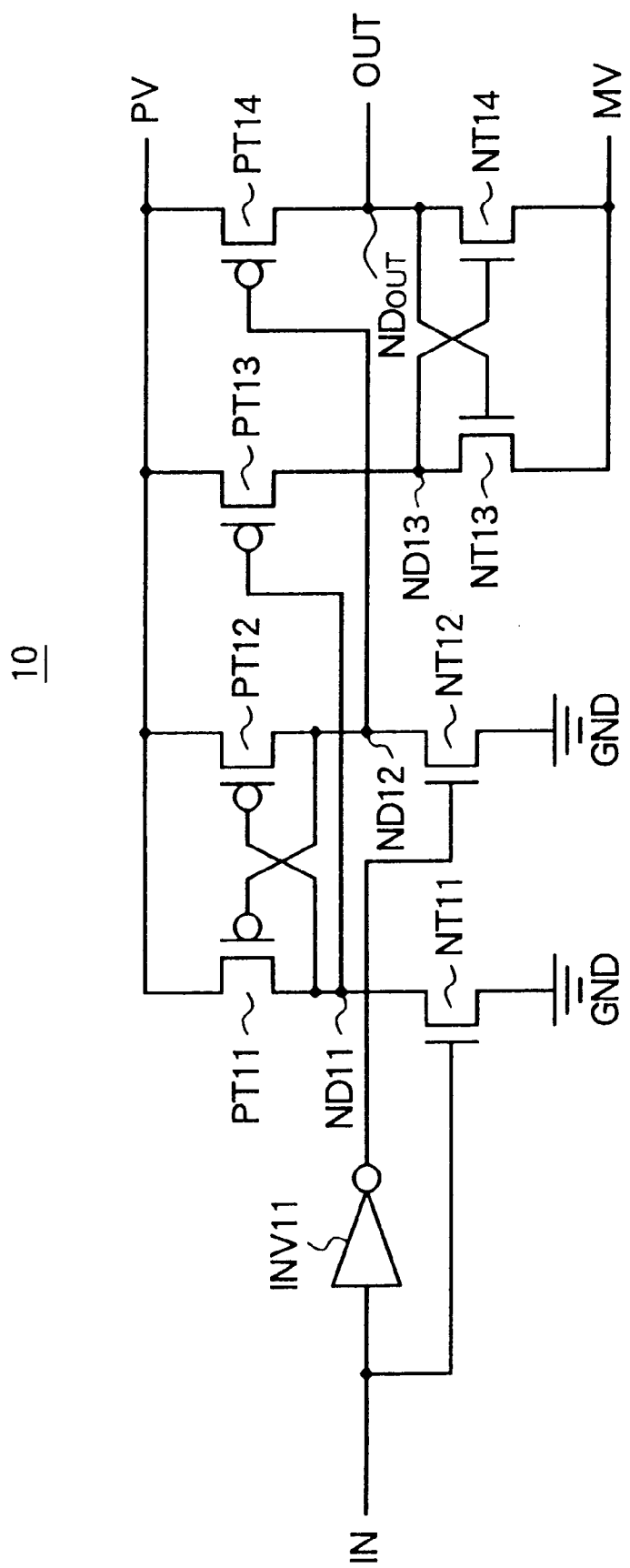
FIG. 1 is a circuit diagram of a first reference example of a level shifter.

FIG. 1 is a circuit diagram of a first reference example of a level shifter.

The level shifter 10 is constituted by an inverter INV11, p-channel (P) metal oxide semiconductor (MOS) transistors. PT11 to PT14, and n-channel (N) MOS transistors NT11 to NT14.

The sources of the PMOS transistors PT11 to PT14 are connected to a supply line of a plus high voltage PV, sources of the NMOS transistors NT11 and NT12 are grounded, and the sources of NMOS transistors NT13 and NT14 are connected to a supply line of a minus high voltage MV.

The drains of the PMOS transistor PT11 and the NMOS transistor NT11 are connected to each other and the connection point connected to gate electrodes of the PMOS transistors PT12 and PT13 as a node ND11. Similarly, the drains of the PMOS transistor PT12 and the NMOS transistor NT12 are connected to each other and the connection point connected to gate electrodes of the PMOS transistors PT11 and PT14 as a node ND12.

The drains of the PMOS transistor PT13 and the NMOS transistor NT13 are connected to each other and the connection point connected to a gate electrode of the NMOS transistor NT14. Similarly, the drains of the PMOS transistor PT14 and the NMOS transistor NT14 are connected to each other and the connection point connected to a gate electrode of the NMOS transistor NT13 as an output node $ND_{OUT}$ A gate electrode of the NMOS transistor NT11 is connected to an input line of an input signal IN, and a gate electrode of the NMOS transistor NT12 is connected to the input line of the input signal IN through the inverter INV11.

In this configuration, when the input signal IN is input at a power supply voltage Vcc level, that is a high level, the NMOS transistor NT11 switches to a conductive state, and the NMOS transistor NT12 is held in a non-conductive state.

As a result, the node ND11 fall to the ground level, and the PMOS transistors PT12 and PT13 switch to the conductive states. Along with the PMOS transistor PT12 becoming conductive, the potential of the node ND12 rises to the plus high voltage PV level, then the PMOS transistor PT11 is held in the non-conductive state stably. Due to this, the conductive states of the PMOS transistors PT12 and PT13 are held stably.

Along with the potential of the node ND12 shifting to the plus high voltage, the PMOS transistor PT13 is held in the non-conductive state. Also, along with the PMOS transistor PT13 becoming conductive, the potential of the node ND13 rises to the plus high voltage PV. As a result, the NMOS transistor NT14 becomes conductive, and the potential of the output node $ND_{OUT}$ falls to the minus high voltage MV level.

Along with the potential of the output node $ND_{OUT}$ becoming the minus high voltage MV level, the NMOS transistor NT13 is held in the non-conductive state stably, and a signal OUT held at the minus high voltage MV level is output from the output node $ND_{OUT}$ When the input signal IN is input at the ground GND level, that is, a low level, the NMOS transistor NT12 becomes conductive, and the NMOS transistor NT11 becomes non-conductive.

As a result, the node ND12 falls to the ground level, and the PMOS transistors PT11 and PT14 switch to the conductive states. Along with the PMOS transistor PT11 becoming conductive, the potential of the node ND11 rises to the plus high voltage PV, and the PMOS transistors PT12 and PT13 become non-conductive and are held in that state stably.

Along with the PMOS transistor PT14 becoming conductive, the potential of the output node $ND_{OUT}$ rises to the plus high voltage PV level, and the NMOS transistor NT13 becomes conductive. An a result, the potential falls to the minus high voltage MV, and the NMOS transistor NT14 is held in the non-conductive state stably.

Figure 2:
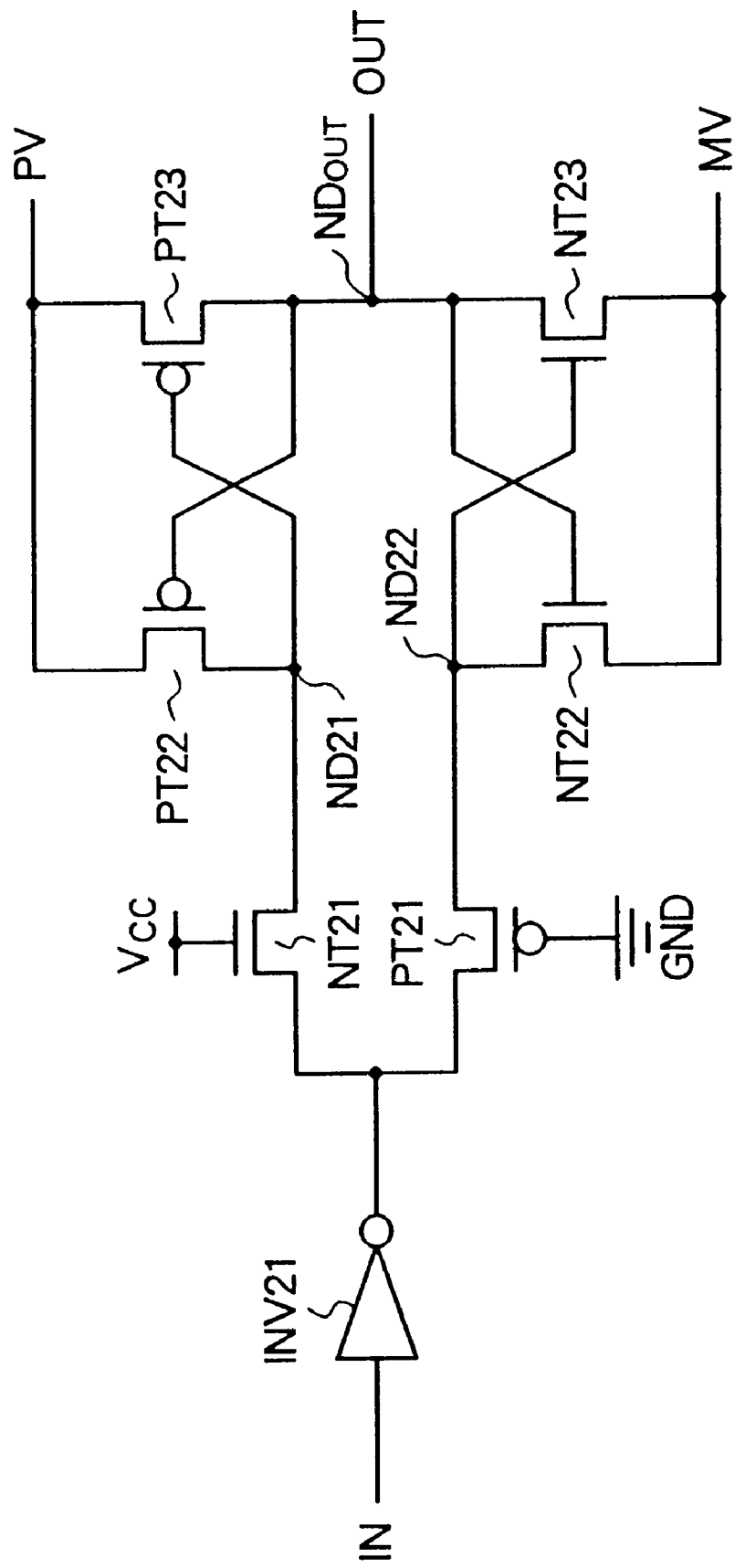
FIG. 2 is a circuit diagram of a second reference example of a level shifter.

Accordingly, the signal OUT held at the plus high voltage PV level is output from the output node $ND_{OUT}$ FIG. 2 is a circuit diagram of a second reference example of a level shifter.

The level shifter 20 is constituted by an inverter INV21, PMOS transistors PT21 to PT23, and NMOS transistors NT21 to NT23.

The NMOS transistor NT21 is connected between an output terminal of the inverter INV21 and a drain of the PMOS transistor PT22 and is connected at its gate electrode to the supply line of the power supply voltage Vcc.

The PMOS transistor PT21 is connected between the output terminal of the inverter INV21 and a drain of the NMOS transistor NT22 and is connected at its gate electrode to the ground line.

The NMOS transistor NT21 and the PMOS transistor PT21 are set to lower threshold voltages than usual transistors at the time of the production and function as so-called cut gates.

The sources of the PMOS transistors PT22 and PT23 are connected to the supply line of the plus high voltage PV, and the sources of the NMOS transistors NT22 and NT23 are connected to the supply line of the minus high voltage MV.

A drain of the PMOS transistor PT22 is connected to a gate electrode of the PMOS transistor PT23, and a drain of the NMOS transistor NT22 is connected to a gate electrode of the NMOS transistor NT23.

An output node $ND_{OUT}$ is constituted by connecting the drains of the PMOS transistor PT23 and the NMOS transistor NT23. The output node $ND_{OUT}$ is connected to the gate electrodes of the PMOS transistor PT22 and the NMOS transistor NT22.

In the circuit of FIG. 2, when the input signal IN is input at the power supply voltage Vcc level, that is, the high level, the input signal IN is inverted by the inverter INV21, then a signal of a substantially ground GND level (low level) is supplied to the gate electrode of the PMOS transistor PT23 through the NMOS transistor NT21 and to the gate electrode of the NMOS transistor NT23 through the PMOS transistor PT21.

As a result, the PMOS transistor PT 23 becomes conductive, the NMOS transistor NT23 becomes non-conductive, and then the potential of the output node $ND_{OUT}$ rises to the plus high voltage PV. Due to this, the PMOS transistor PT22 is held in the non-conductive state stably and the NMOS transistor NT22 is held in the conductive state stably, the potential of the node ND22 falls to the minus high voltage MV, and the NMOS transistor NT23 is held in the non-conductive state stably. At this time, the PMOS transistor PT21 becomes cut-off.

Accordingly, the signal OUT held at the plus high voltage PV is output from the output node $ND_{OUT}$.

When the input signal IN is input at the ground GND level, that is, the low level, the PMOS transistor PT23 becomes non-conductive, the NMOS transistor NT23 becomes conductive, and the potential of the output node $ND_{OUT}$ falls to the minus high voltage MV. Due to this, the PMOS transistor PT22 becomes conductive, and the NMOS transistor NT22 becomes non-conductive.

Along with the PMOS transistor becoming conductive, the potential of the node ND21 rises to the plus high voltage PV, and the PMOS transistor PT23 is held in the non-conductive state stably. At this time, the NMOS transistor NT21 becomes cut-off.

Accordingly, the signal OUT held at the minus high voltage MV level is output from the output node $ND_{OUT}$.

The circuit of FIG. 1, however, has a two stage configuration, that is, converts from the ground GND level—power supply voltage Vcc level to the ground GND level—plus high voltage PV at a first stage and converts to the plus high voltage PV—minus high voltage MV in a second stage. Therefore, a minimum of eight transistors is required. Also, since the p-channel/n-channel ratio in the final inverter is imbalanced, in many cases another one or two inverters are needed, so the area of the layout increases.

The circuit of FIG. 2 on the other hand is constituted by a single stage end requires a smaller number of transistors, for example, six. However, it requires a cut gate and requires use of a low threshold transistor for this cut gate or else the operating margin with respect to the power supply voltage Vcc will fall at a low voltage.

Further, formation of a low threshold transistor requires an increase in the number of steps in the production process.

Figure 3:
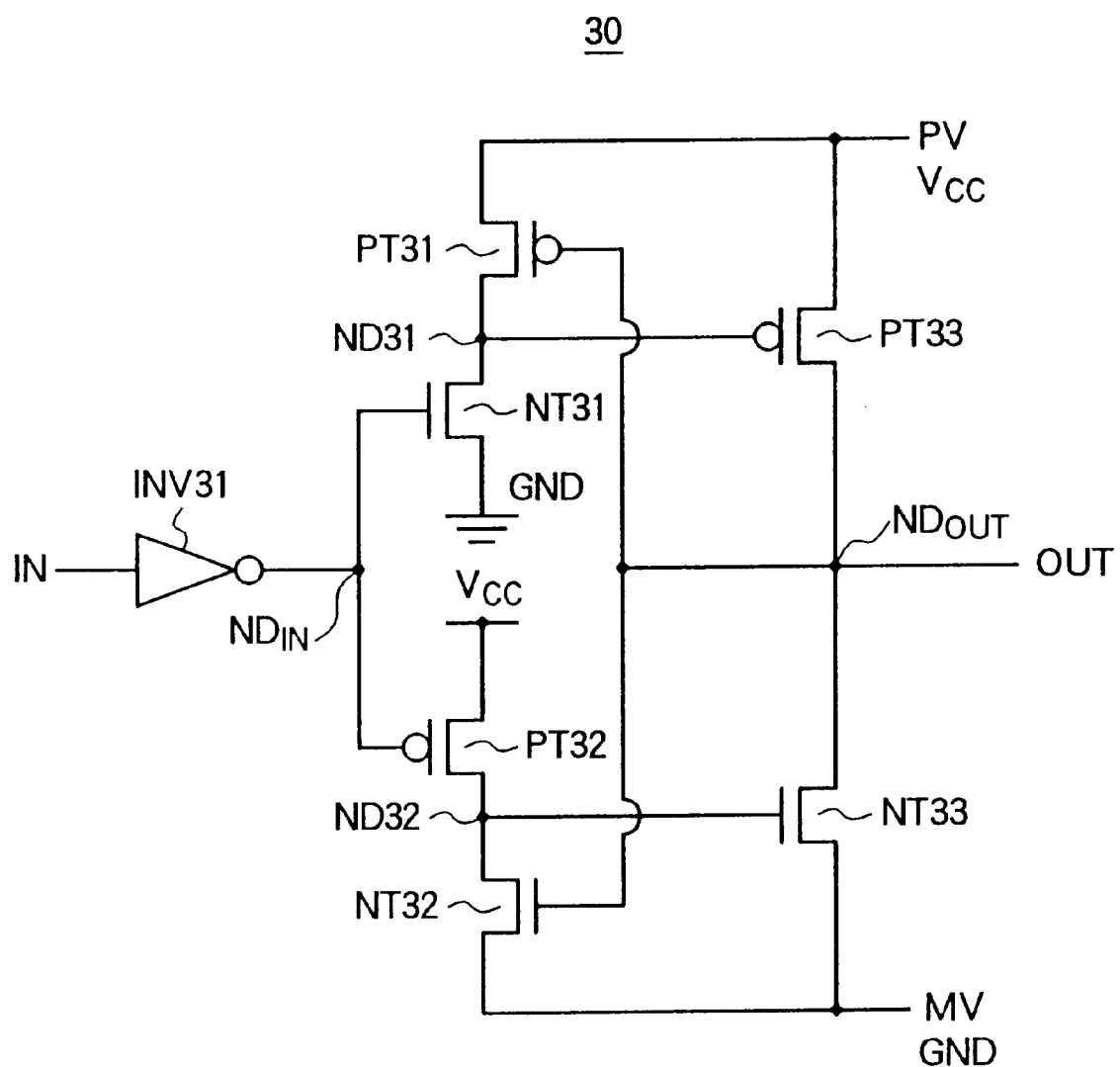
FIG. 3 is a circuit diagram of a first embodiment of a level shifter according to the present invention.
Figure 4:
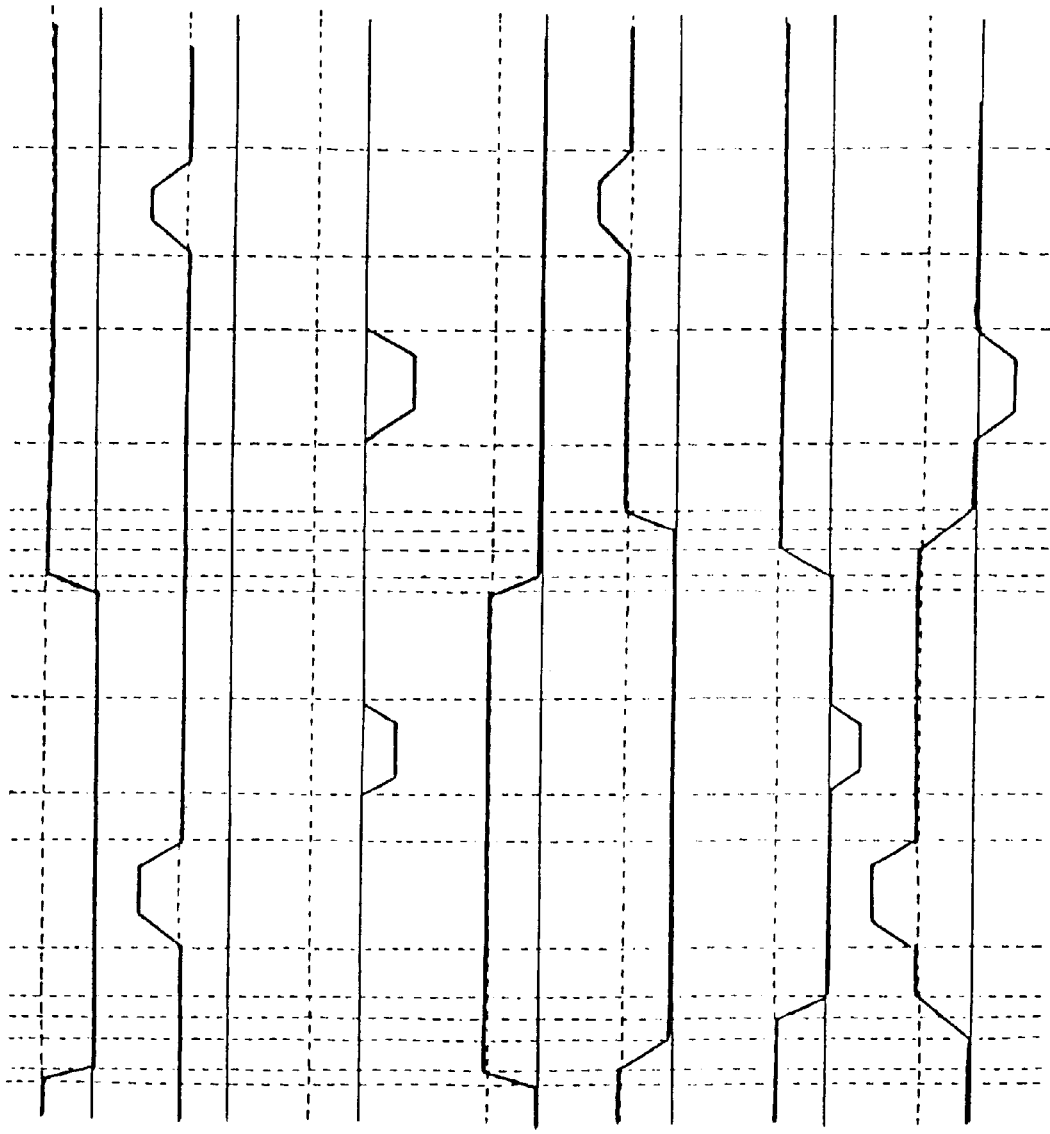
FIGS. 4A to 4G are timing charts showing the timing in an operation of the circuit shown in FIG. 3.

FIG. 3 is a circuit diagram of a first embodiment of a level shifter according to the present invention.

As shown in FIG. 3, the level shifter 30 is constituted by an inverter INV31, a PMOS transistor PT31 serving as the third transistor, a PMOS transistor PT32 serving as the sixth transistor, a PMOS transistor PT33 serving as the first transistor, an NMOS transistor NT31 serving as the fifth transistor, an NMOS transistor NT32 serving as the fourth transistor, and an NMOS transistor NT33 serving as the second transistor. The second inverter is constituted by the PMOS transistor PT32.

Specifically, the sources of the PMOS transistors PT31 and PT33 are connected to a line connected to a not illustrated high level power supply and supplying a plus high-voltage PV and a power supply voltage Vcc, the sources of the NMOS transistors NT32 and NT33 are connected to a line connected to a not illustrated low level power supply and supplying a minus high voltage MV and a ground voltage GND (0V), the source of the NMOS transistor NT31 is grounded, and the source of the PMOS transistor PT32 is connected to a line supplying the power supply voltage Vcc.

The drains of the PMOS transistor PT31 and the NMOS transistor NT31, the drains of the PMOS transistor PT32 and the NMOS transistor NT32, and the drains of the PMOS transistor PT33 and the NMOS transistor NT33 are connected to each other.

Namely, the PMOS transistor PT31 and the NMOS transistor NT31 are connected in series between the supply line of the plus high voltage PV and the power supply voltage Vcc and the ground GND line, and the PMOS transistor PT32 and the NMOS transistor NT32 are connected in series between the supply line of the power supply voltage Vcc and the supply line of the minus high voltage MV and the ground voltage GND. The PMOS transistor PT33 and the NMOS transistor NT33 constituting an output buffer are connected in series between the supply line of the plus high voltage PV and the power supply voltage Vcc and the supply line of the minus high voltage MV and the ground voltage GND.

An input terminal of the inverter INV31 is connected to the input line of the signal IN, gate electrodes of the NMOS transistor NT31 and the PMOS transistor PT32 are connected to an output terminal of the inverter INV31, and a node $ND_{IN}$ is constituted by the connection point.

A node ND31 serving as the output terminal of the first inverter is constituted by the connection point of the drains of the PMOS transistor PT31 and the NMOS transistor NT31. The node ND31 is connected to a gate electrode of the PMOS transistor PT33.

Similarly, a node ND32 serving as the output terminal of the second inverter is constituted by the connection point of the drains of the PMOS transistor PT32 and the NMOS transistor NT32. The node ND32 is connected to a gate electrode of the NMOS transistor NT33.

Further, an output node $ND_{OUT}$ is constituted by the connection point of the drains of the PMOS transistor PT33 and the NMOS transistor NT33. The output node $ND_{OUT}$ is connected (fed back) to the gate electrodes of the PMOS transistor PT31 and the NMOS transistor NT32.

Note that, in the level shifter 10, the size of the NMOS transistor NT31 is made larger, for example, two times larger, than the PMOS transistor PT31.

The size of the PMOS transistor PT32 is made larger, for example, four times larger, than the NMOS transistor NT32.

Next, an explanation will be made of the operation of the above constitution with reference to the timing charts of FIGS. 4A to 4G.

First, an explanation will be made of the operation at the time of a switch of the level of the input signal IN from the power supply voltage Vcc level (high level) to the ground GND level (low level).

When switching the input signal IN, the PMOS transistors PT31 and PT32 and the NMOS transistor NT33 are held in the conductive state, and the NMOS transistors NT31 and NT32 and the PMOS transistor PT33 are held in the non-conductive state.

When the level of the input signal IN switches from the high level, that is, the power supply voltage Vcc level, to the low level, that is, the ground GND level, the level of the node $ND_{IN}$ switches from the ground GND level to the power supply voltage Vcc. Due to this, the NMOS transistor NT31 switches to the conductive state, and the PMOS transistor PT32 switches to the non-conductive state.

Along with the PMOS transistor PT32 switching to the non-conductive state, the node ND32 becomes excessively floating. Also, along with the NMOS transistor PT31 switching to the conductive state, the series connected PMOS transistor PT31 and the NMOS transistor NT31 both become conductive. But, as the size of the NMOS transistor NT31 is set sufficiently larger than the PMOS transistor PT31, the level of the node ND31 inverts to the ground GND level, that is, the low level.

Along with the node ND31 shifting to the ground GND level, the PMOS transistor PT33 of the output stage switches to the conductive state gradually and the level of the output node $ND_{OUT}$ rises gradually. When it becomes about Vcc/2, the NMOS transistor NT32 becomes conductive and the PMOS transistor PT31 becomes non-conductive. Due to this, the node ND32 shifts to the ground GND level, and the NMOS transistor NT33 switches to the non-conductive state. At this tire, the PMOS transistor PT31 becomes completely non-conductive.

As a result, the logic of the output signal OUT is fixed at the high level.

After the logic becomes fixed, the supply level of the plus side is switched from the power supply voltage Vcc to a further high voltage PV, then a signal OUT held at the plus high voltage PV level is output from the output node $ND_{OUT}$ When the level of the minus side switches from the ground GND level to the minus high voltage MV level, a signal OUT held at the power supply voltage Vcc level is output from the output node $ND_{OUT}$ Next, an explanation will be made of the operation at the time of a switch of the level of the input signal IN from the ground GND level (low level) to the power supply voltage Vcc level (high level).

At the time of the switching of the input signal IN, the PMOS transistors PT31 and PT32 and the NMOS transistor NT33 are held in the non-conductive state, and the NMOS transistors NT31 and NT32 and the PMOS transistor PT33 are held in the conductive state.

When the level of the input signal IN switches from the low level, that is, the ground GND level, to the high level, that is, the power supply voltage Vcc level, the level of the node $ND_{IN}$ switches from the power supply voltage Vcc level to the ground GND level. Due to this, the NMOS transistor NT31 switches to the non-conductive state, and the PMOS transistor PT32 switches to the conductive state.

Along with the NMOS transistor NT31 switching to the non-conductive state, the node ND31 becomes excessively floating. Also, along with the PMOS transistor PT31 switching to the conductive state, both the series connected PMOS transistor PT32 and the NMOS transistor NT32 become conductive. As the size of the PMOS transistor PT32 is set sufficiently larger than the NMOS transistor NT32, however, the level of the node ND32 inverts to the power supply voltage Vcc level, that is, the high level.

Along with the node ND32 shifting to the power supply voltage Vcc level, the NMOS transistor NT33 of the output stage switches to the conductive state gradually, and the level of the output node $ND_{OUT}$ falls gradually. When it becomes about 0V, the NMOS transistor NT32 becomes non-conductive. Along with the PMOS transistor PT31 becoming conductive, the node ND31 shifts to the power supply voltage Vcc level, and the PMOS transistor PT33 switches to the non-conductive state. Due to this, the non-conductive state of the PMOS transistor PT33 and the conductive state of the NMOS transistor NT33 are held stably.

As a result, the logic of the output signal OUT is fixed at the ground GND level (0V), that is, the low level.

Figure 5:
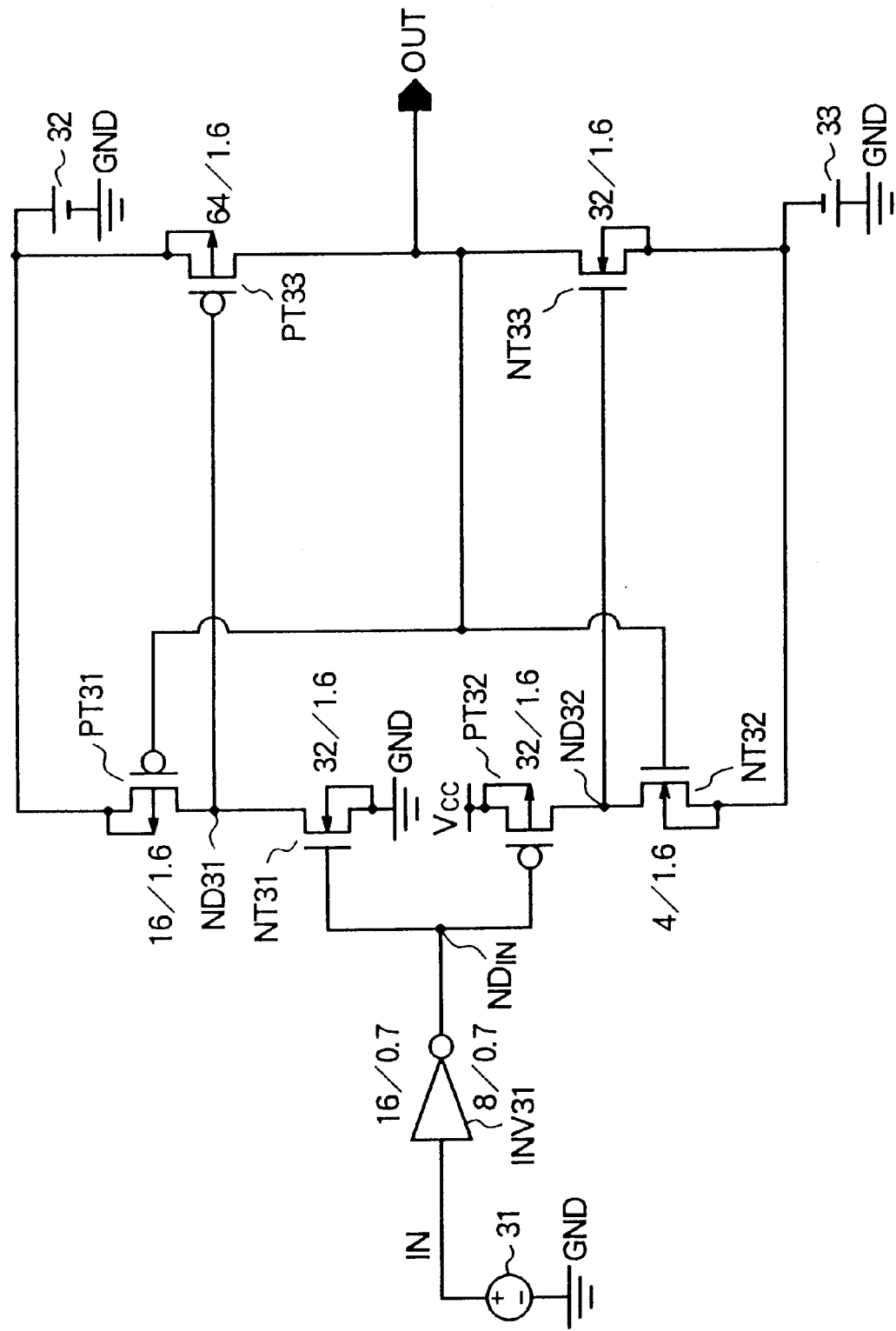
FIG. 5 is a circuit diagram with circuit parameters at a simulation of the circuit shown in FIG. 3.
Figure 6:
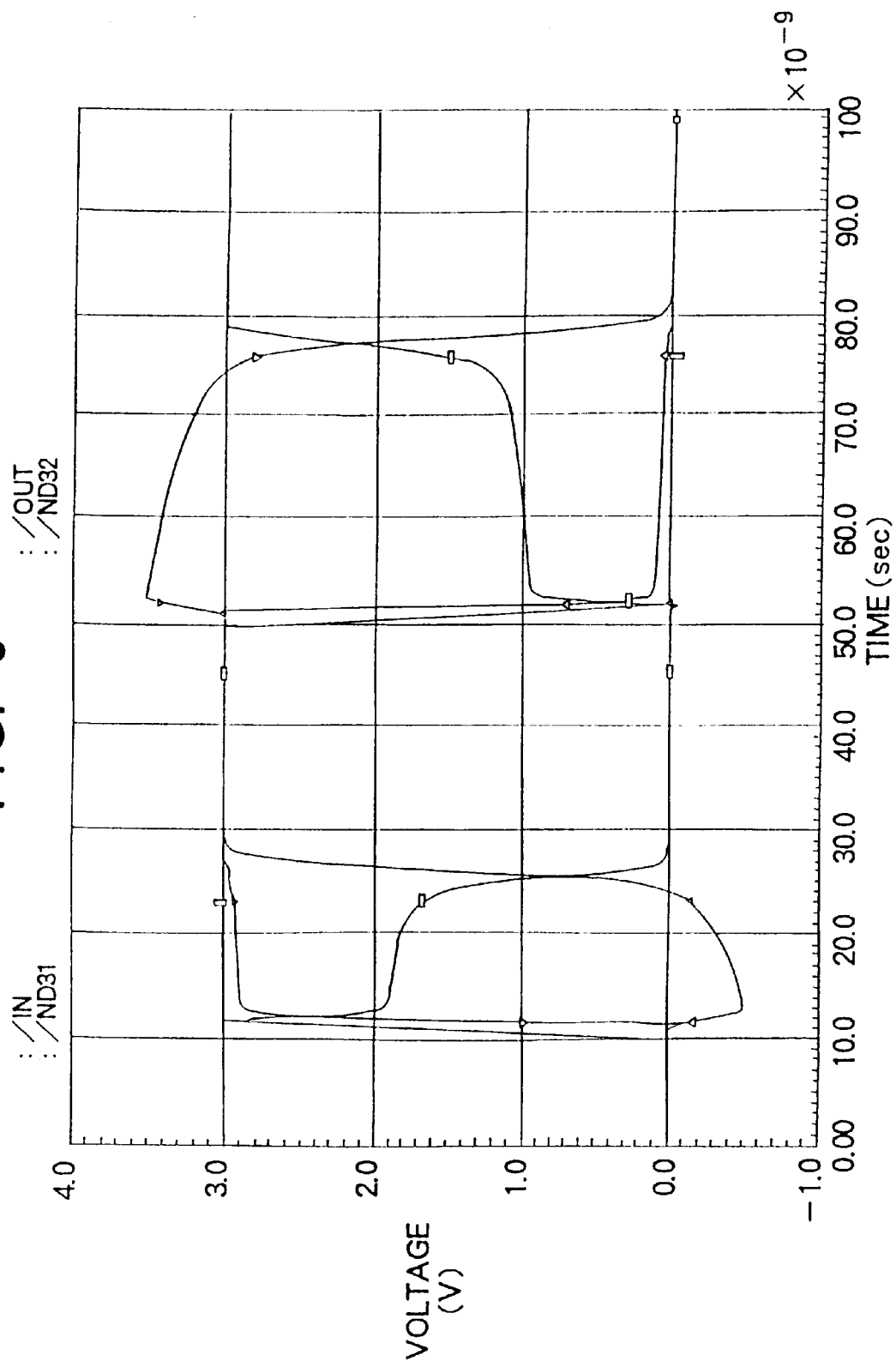
FIG. 6 is a view of the results of a simulation of the circuit shown in FIG. 5.

After the logic becomes fixed, the supply level of the minus side is switched from the ground GND level to the further lower minus voltage MV, then a signal OUT held at the minus high voltage MV level is output from the output node $ND_{OUT}$ When the level of the plus side switches from the power supply voltage Vcc level to the plus high voltage PV level, the signal OUT is output from the output node $ND_{OUT}$ FIG. 5 is a circuit diagram with circuit parameters at a simulation of the circuit shown in FIG. 3, and FIG. 6 is a view of the results of the simulation.

In FIG. 5, 31 shows a signal source, 32 shows a plus high voltage source, and 33 shown a minus high voltage source. The sizes (channel width W/channel length L) of the transistors are additionally shown.

In FIG. 6, the abscissa shows the time, and the ordinate shows the voltage.

In this simulation, the power supply voltage Vcc is set to 3V.

As understood from FIG. 6, the circuit of FIG. 5 (FIG. 3) functions satisfactorily as a level shifter even with a low power supply voltage.

As explained above, according to the first embodiment, the PMOS transistor PT31 and the NMOS transistor NT31 are connected in series between the supply line of the plus high voltage PV and the power supply voltage Vcc and the ground GND line, the PMOS transistor PT32 and the NMOS transistor NT32 are connected in series between the supply line of the power supply voltage Vcc and the minus high voltage MV and the ground voltage GND, the PMOS transistor PT33 and the NMOS transistor NT33 constituting an output buffer are connected in series between the supply line of the plus high voltage PV and the power supply voltage Vcc and the supply line of the minus high voltage MV and the ground voltage GND, the input terminal of the inverter INV31 is connected to the input line of the signal IN, gate electrodes of the NMOS transistor NT31 and the PMOS transistor PT32 are connected to an output terminal of the inverter INV31, the connection point of the drains of the PMOS transistor PT31 and the NMOS transistor NT31 is connected to the gate electrode of the PMOS transistor PT33, the connection point of the drains of the PMOS transistor PT32 and the NMOS transistor NT32 is connected to the gate electrode of the NMOS transistor NT33, an output node $ND_{OUT}$ constituted by the connection point of the drains of the PMOS transistor PT33 and the NMOS transistor NT33 is connected (fed back) to the gate electrodes of the PMOS transistor PT31 and the NMOS transistor NT32, the size of the NMOS transistor NT31 is made larger than the PMOS transistor PT31, and the size of the PMOS transistor PT32 is made larger than the NMOS transistor NT32.

Therefore, it in possible to reduce the area of layout and realize stable operation even with a low power supply voltage and reduce the number of masks required at the time of production.

Figure 7:
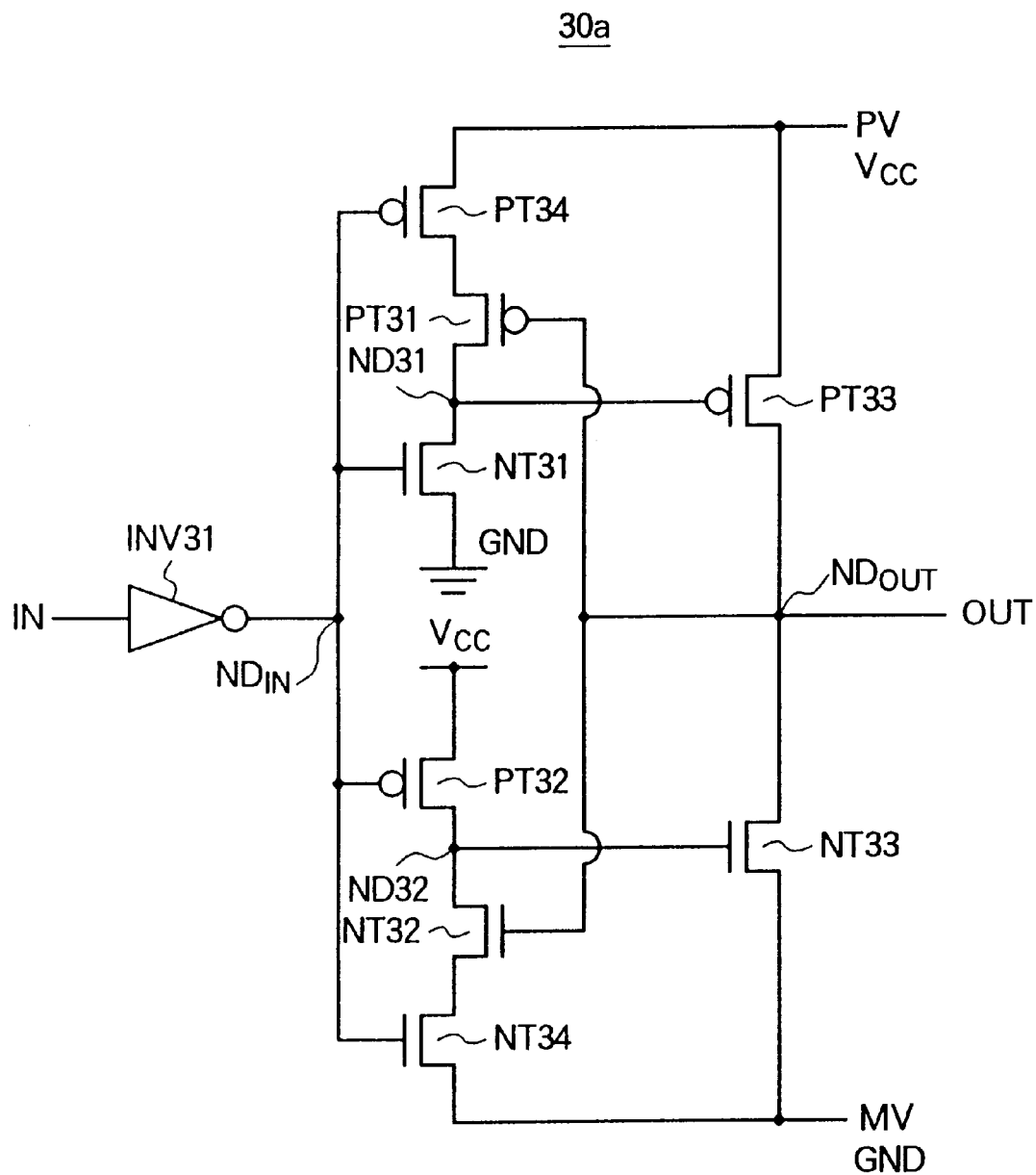
FIG. 7 is a circuit diagram of a second embodiment of a level shifter according to the present invention.

FIG. 7 is a circuit diagram of a second embodiment of the level shifter according to the present invention.

The difference of this second embodiment from the first embodiment is that a PMOS transistor PT34 serving as the seventh transistor with a gate electrode connected to the node $ND_{IN}$ is connected in series between the supply line of the plus high voltage PV and the power supply voltage Vcc (connected to a not illustrated high level power supply) and the source of the PMOS transistor PT31, and a NMOS transistor NT34 serving as the eighth transistor with a gate electrode connected to the node $ND_{IN}$ is connected in series between the supply line of the minus high voltage MV and the ground voltage GND (connected to a not illustrated low level power supply) and the source of the NMOS transistor NT32.

In the level shifter 30a, due to the PMOS transistor PT34 and the NMOS transistor NT34, which are controlled In conductive state by the output level of the inverter INV31, it is possible to prevent both of the transistors of the inverter constituted by the PMOS transistor PT34 and the NMOS transistor NT31 and the inverter constituted by the PMOS transistor PT32 and the NMOS transistor NT32 from switching becoming conductive state at the same time and, due to this, to reduce the current consumption.

For example, when the level of the input signal IN switches from the power supply voltage Vcc level to the ground GND level, the PMOS transistor PT34 becomes non-conductive, then the level of the node ND31 shifts to the ground GND level quickly. As a result, the PMOS transistor PT33 of the output stage also switches to the conductive state and the potential of the output node $ND_{OUT}$ quickly rises.

Further, while the circuit 30 of FIG. 3 required the ratio of capacity (p-channel/n-channel) between the inverter constituted by the PMOS transistor PT31 and the NMOS transistor NT31 and the inverter constituted by the PMOS transistor PT32 and the NMOS transistor NT32 of the first stage to be set to 4:1 or more, the circuit 30a of FIG. 7 enables the ratio of capacity of the inverters of the first stage to be set to 1:1. Accordingly, the circuit of FIG. 7 is more suitable for high speed operation than the circuit 30 of FIG. 3.

Figure 8:
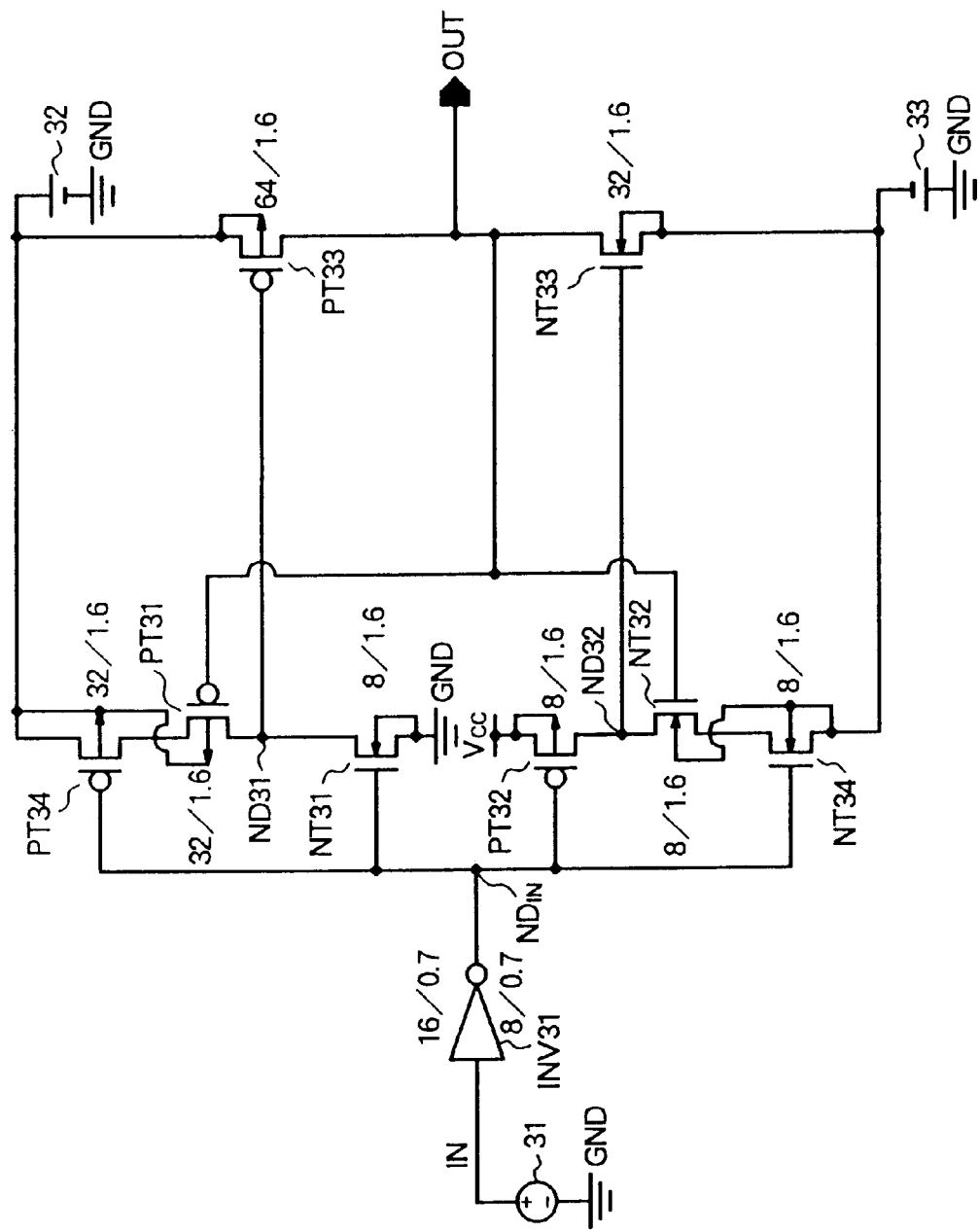
FIG. 8 is a circuit diagram with circuit parameters at a simulation of the circuit shown in FIG. 7.
Figure 9:
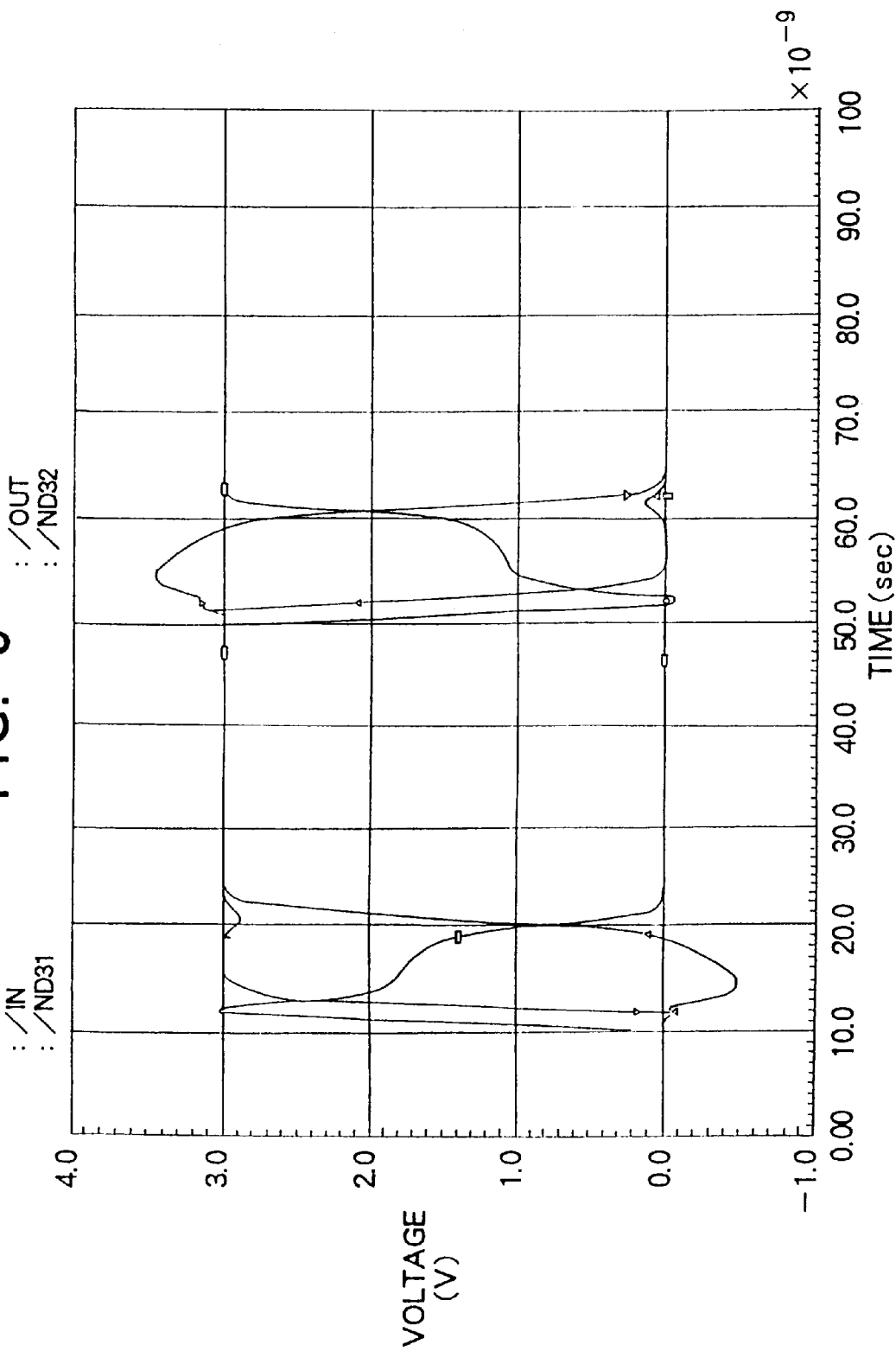
FIG. 9 is a view of the results of a simulation of the circuit shown in FIG. 8.

FIG. 8 is a circuit diagram with circuit parameters at a simulation of the circuit shown in FIG. 7, and FIG. 9 is a view of the results of the simulation.

In FIG. 8, 31 shows a signal source, 32 shows a plus high voltage source, and 33 shows a minus high voltage source. The sizes (channel width W/channel length L) of the transistors are additionally shown.

In FIG. 9, the abscissa shows the time, and ordinate shows the voltage.

In this simulation, the power supply voltage Vcc is set to 3V.

As understood from FIG. 9, the circuit of FIG. 5 (FIG. 3) functions satisfactorily as a level shifter with a low power supply voltage of course and also realizes higher speed operation in comparison with FIG. 6 showing the characteristics of FIG. 5 (FIG. 3).

Due to this, the circuit 30a of FIG. 7 according to the second embodiment can operate faster than the circuit 30 of FIG. 3.

Note that, in the circuit shown in FIG. 7, while the number of transistors rises from six to eight, the additional transistors PT34 and NT34 are connected in series to the originally provided transistors PT31, NT31, PT32, and NT32, so the increase of the area of the layout is not that large. Rather, assuming the same speed, it is possible to reduce the area since it is possible to reduce the size of the transistors.

Figure 10:
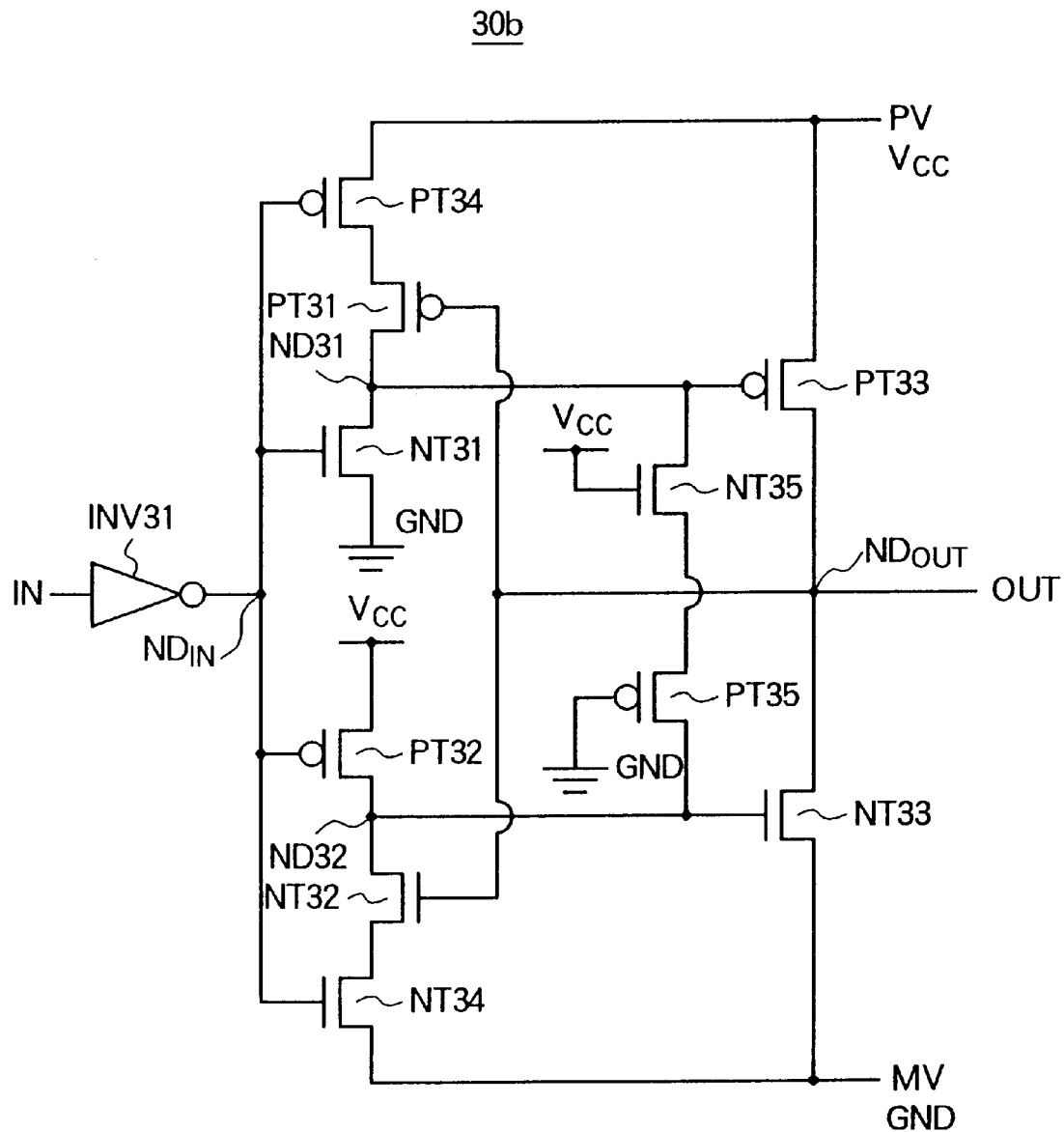
FIG. 10 is a circuit diagram of a third embodiment of a level shifter according to the present invention.

FIG. 10 is a circuit diagram of a third embodiment of a level shifter according to the present invention.

The difference of this third embodiment from the second embodiment is that an NMOS transistor NT35 serving as the cut gate (ninth transistor) with gate electrode connected to the power supply voltage Vcc and a PMOS transistor PT35 (10th transistor) serving as the cut gate with a gate electrode which are grounded are connected in series between the node ND31 and the node ND32.

Due to this configuration, there is no longer a time at which the node ND31 or the node ND32 becomes floating and therefore it is possible to realize a faster speed.

For example, in the circuit of FIG. 7, when the level of the input signal IN switched from the power supply voltage Vcc level to the ground GND level, the level of the node $ND_{IN}$ switched from the ground GND level to the power supply voltage Vcc level, the NMOS transistor switched to the conductive state, and the PMOS transistor PT31 switched to the non-conductive state, whereby the node 32 became excessively floating.

In the circuit of FIG. 10, the nodes ND31 and ND32 become conductive due to the NMOS transistor NT35 and the PMOS transistor PT35 serving as the cut gates and are therefore prevented from floating. The potential of the node ND32 shifts to the ground GND level. Namely, the potential of the node ND31 shifts to the ground GND level before the feedback of the level of the output node $ND_{OUT}$ When the NMOS transistor NT32 becomes conductive due to the potential of the output node $ND_{OUT}$ rising to about Vcc/2, since the NMOS transistor NT34 is held in the conductive state at that time, the node ND32 is connected to the supply line of the minus high voltage MV. When the potential of the node ND32 falls to less than the ground GND level, the NMOS transistor PT35 becomes cut-off and the conductive state between the nodes ND31 and ND32 is released.

Similarly, in the circuit of FIG. 7, when the level of the input signal IN switched from the ground GND level to the power supply voltage Vcc level, the level of the node $ND_{IN}$ switched from the power supply voltage Vcc level to the ground GND level, the NMOS transistor switched to the non-conductive state, and the PMOS transistor PT31 switched to the conductive state, whereby the node 32 became excessively floating.

In the circuit of FIG. 10, on the other hand, the nodes ND31 and ND32 become conductive due to the NMOS transistor NT35 and the PMOS transistor PT35 serving as the cut gates and are prevented from floating. The potential of the node ND32 shifts to about the power supply voltage Vcc level. Namely, the potential of the node ND31 shifts to the power supply voltage Vcc level before the feedback of the level of the output node $ND_{OUT}$ When the PMOS transistor PT31 becomes conductive due to the potential of the output node $ND_{OUT}$ falling to about the ground GND level Vcc/2, since the PMOS transistor PT34 is held in the conductive state at this time, the node ND31 is connected to the supply line of the plus high voltage PV. When the potential of the node ND31 rises above the power supply voltage Vcc level, the NMOS transistor NT35 becomes cut-off and the conductive state between the nodes ND31 and ND32 is released.

Figure 11:
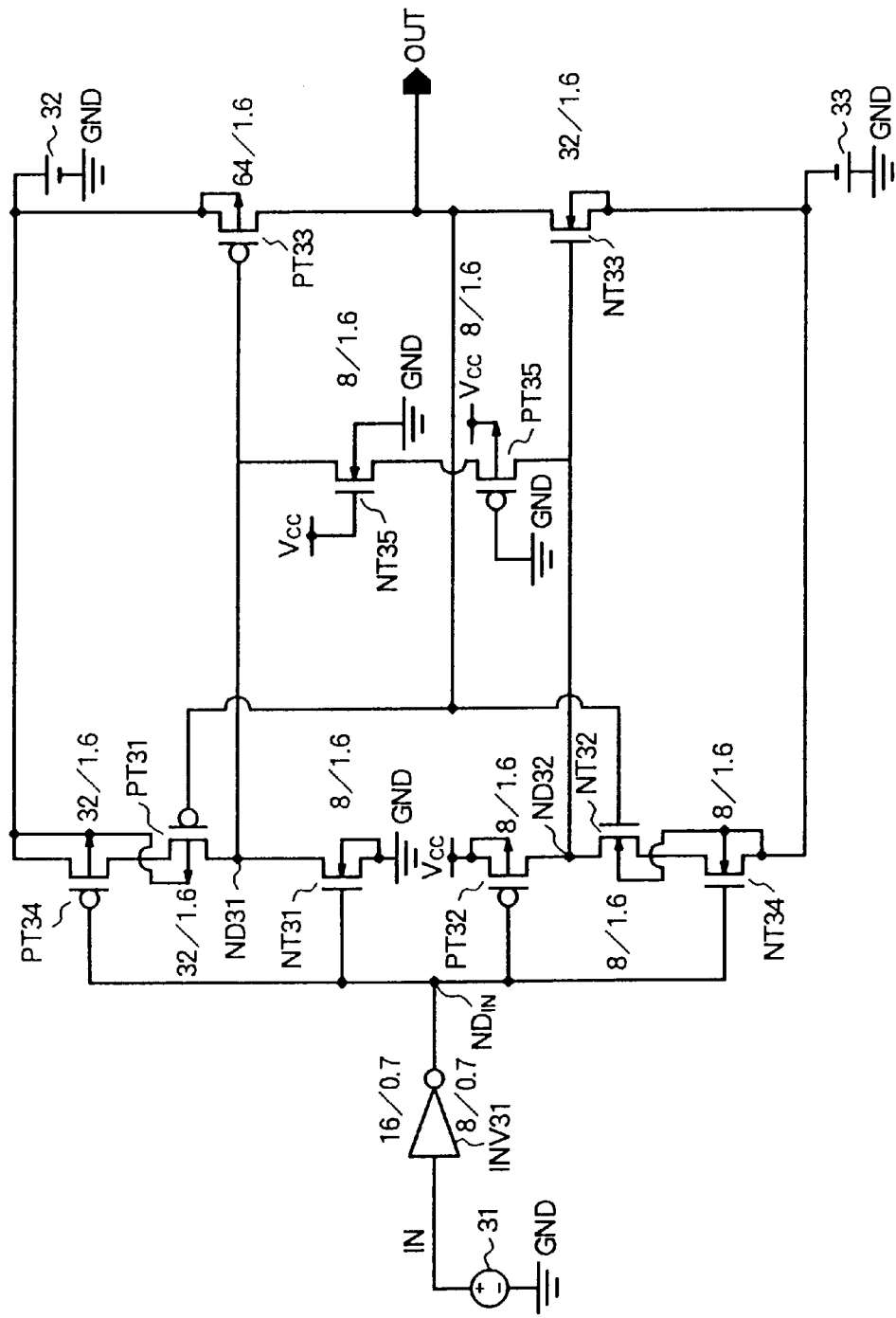
FIG. 11 is a circuit diagram with circuit parameters at a simulation of the circuit shown in FIG. 10.
Figure 12:
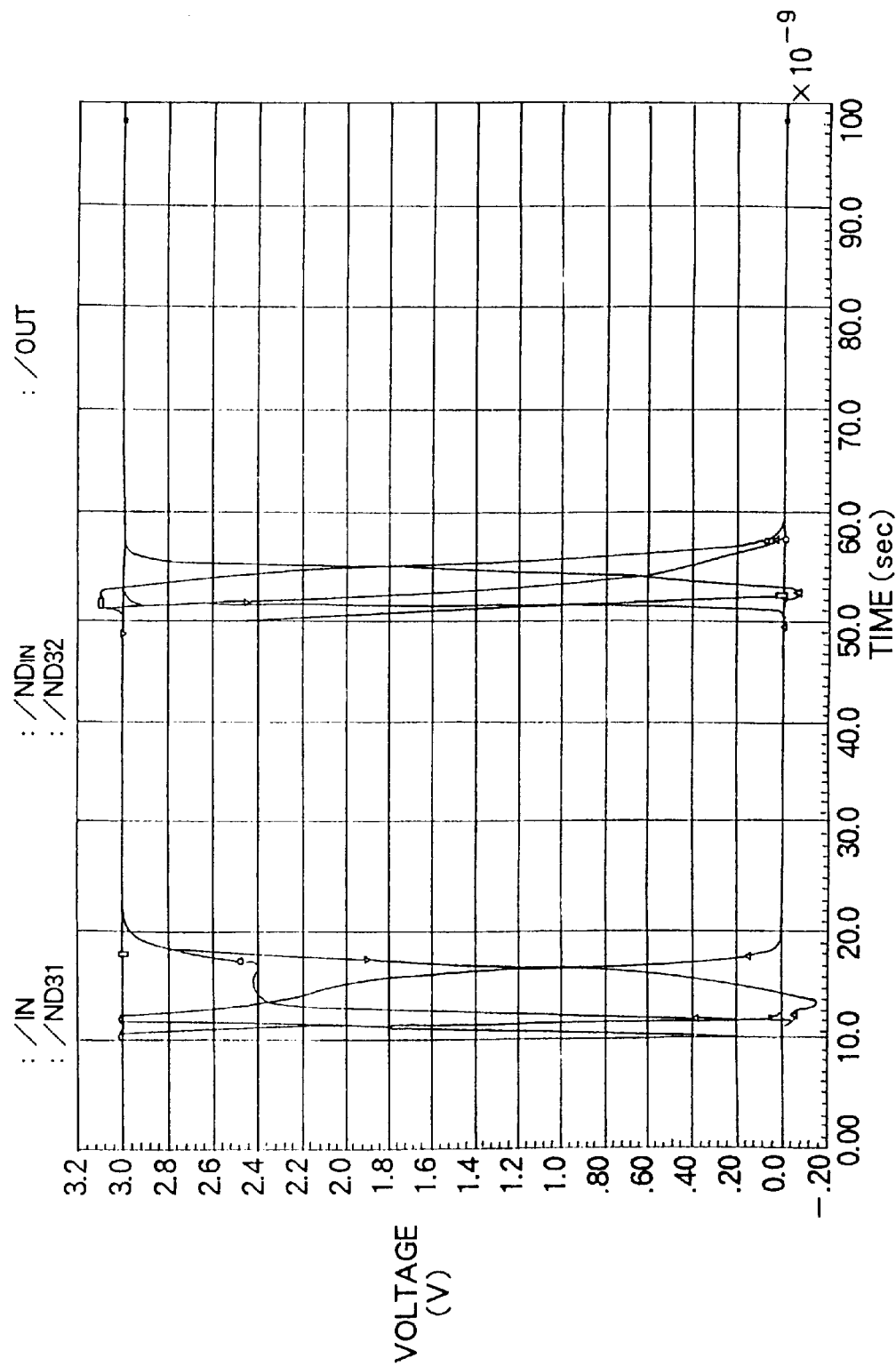
FIG. 12 is a view of the results of a simulation of the circuit shown in FIG. 11.

FIG. 11 is a circuit diagram with circuit parameters at a simulation of the circuit shown in FIG. 10, and FIG. 12 is a view of the results of the simulation.

In FIG. 11, 31 shows a signal source, 32 shows a plus high voltage source, and 33 shows a minus high voltage source. The sizes (channel width W/channel length L) of the transistors are additionally shown.

In FIG. 12, the abscissa shows the time, and ordinate shows the voltage.

In this simulation, the power supply voltage Vcc is set to 3V.

As understood from FIG. 12, the circuit of FIG. 11 (FIG. 10) functions satisfactorily as a level shifter with a low power supply voltage of course and also realizes a higher speed operation in comparison with FIG. 9 showing the characteristics of FIG. 8 (FIG. 7).

What is claimed is:

1. A level shifter, comprising:
   a first power supply terminal,
   a second power supply terminal,
   a signal input terminal supplied with an input signal,
   a high potential power supply terminal with a potential higher than the potential of the first power supply terminal,
   a low potential power supply terminal with a potential lower than the potential of the second power supply terminal,
   a first inverting stage and a second inverting stage connected to the signal input terminal, wherein said first inverting stage is connected to said second power supply terminal and said second inverting stage is connected to said first power supply terminal,
   a first transistor connected to the first inverting stage such that said first transistor connects an output terminal of the level shifter and the high potential power supply terminal upon the fall of an output potential of the first inverting stage, and
   a second transistor connected to the second inverting stage such that said second transistor connects the output terminal of the level shifter and the low potential power supply terminal upon the rise of an output potential of the second inverting stage,
   the first inverting stage supplied with a current from the high potential power supply terminal upon the fall of the potential of the output terminal of the level shifter, and
   the second inverting stage supplied with a current from the low potential power supply terminal upon the rise of the potential of the output terminal of the level shifter.

2. The level shifter according to claim 1, wherein:
   the first inverting stage is constituted by a first current supply means for supplying a current at the time of a fall of the potential of the output terminal of the level shifter and a third transistor with a gate electrode connected to the signal input terminal, the first current supply means and the third transistor being connected in series between the high potential power supply terminal and the second power supply terminal and the output terminal being constituted by the connection point of the first current supply means and the third transistor, and
   the second inverting stage is constituted by a fourth transistor with a gate electrode connected to the signal input terminal and a second current supply means for supplying the current at the time of a rise of the potential of the output terminal of the level shifter, the fourth transistor and the second current supply means being connected in series between the first supply terminal and the low potential power supply terminal and the output terminal being constituted by the connection of the fourth transistor and the second current supply means.

3. The level shifter according to claim 2, wherein:
   the first current supply means is constituted by a fifth transistor with an input terminal connected to the output terminal of the level shifter, and
   the second current supply means is constituted by a sixth transistor with an input terminal connected to the output terminal of the level shifter.

4. The level shifter according to claim 2, wherein:
   the first current supply means is constituted by a fifth transistor with an input terminal connected to the output terminal of the level shifter and a seventh transistor with an input terminal connected to the signal input terminal, the fifth and seventh transistors being connected in series, and
   the second current supply means is constituted by a sixth transistor with an input terminal connected to the output terminal of the level shifter and an eighth transistor with an input terminal connected to the signal input terminal, the sixth and eighth transistors being connected in series.

5. The level shifter according to claim 4, wherein:
   the output of the first inverting stage is connected to one of the source-drain terminals of a ninth transistor which is cut-off by a voltage of the output terminal of the first inverting stage higher than the potential of the first power supply terminal,
   the output of the second inverting stage is connected to one of the source-drain terminals of a tenth transistor which is cut-off by a voltage of the output terminal of the second inverting stage lower than the potential of the second power supply terminal, and
   the other source-drain terminal of the ninth transistor and the other source-drain terminal of the tenth transistor are connected.

6. The level shifter of claim 1, wherein said signal input terminal is connected to an inverter.

7. The level shifter of claim 2, wherein said signal input terminal is connected to an inverter.

8. The level shifter of claim 3, wherein said signal input terminal is connected to an inverter.

9. The level shifter of claim 4, wherein said signal input terminal is connected to an inverter.

10. The level shifter of claim 5, wherein said signal input terminal is connected to an inverter.

11. A level shifter, comprising:
    a first power supply terminal,
    a second power supply terminal,
    a signal input terminal supplied with an input signal,
    a high potential power supply terminal with a potential higher than the potential of the first power supply terminal,
    a low potential power supply terminal with a potential lower than the potential of the second power supply terminal,
    a first inverting stage and a second inverting stage connected to the signal input terminal, wherein said first inverting stage is connected to said second power supply terminal and said second inverting stage is connected to said first power supply terminal,
    a first transistor connected to the first inverting stage such that said first transistor connects an output terminal of the level shifter and the high potential power supply terminal upon the fall of an output potential of the first inverting stage, and
    a second transistor connected to the second inverting stage such that said second transistor connects the output terminal of the level shifter and the low potential power supply terminal upon the rise of an output potential of the second inverting stage,
    the first inverting stage supplied with a current from the high potential power supply terminal upon the fall of the potential of the output terminal of the level shifter, wherein the first inverting stage is constituted by a third transistor with a gate electrode connected to the signal input terminal and a fifth transistor for supplying a current at the time of a fall of the potential of the output terminal of the level shifter, the third transistor and the fifth transistor being connected in series between the high potential power supply terminal and the second power supply terminal and the output terminal being constituted by the connection point of the third transistor and the fifth transistor, and the second inverting stage supplied with a current from the low potential power supply terminal upon the rise of the potential of the output terminal of the level shifter, wherein the second inverting stage is constituted by a fourth transistor with a gate electrode connected to the signal input terminal and a sixth transistor for supplying the current at the time of a rise of the potential of the output terminal of the level shifter, the fourth transistor and the sixth transistor means being connected in series between the first supply terminal and the low potential power supply terminal and the output terminal being constituted by the connection of the fourth transistor and the sixth transistor.

12. The level shifter of claim 11, wherein said signal input terminal is connected to an inverter.

13. A level shifter, comprising:

a first power supply terminal, a second power supply terminal, a signal input terminal supplied with an input signal, a high potential power supply terminal with a potential higher than the potential of the first power supply terminal, a low potential power supply terminal with a potential lower than the potential of the second power supply terminal, a first inverting stage and second inverting stage connected to the signal input terminal, wherein said first inverting stage is connected to said second power supply terminal and said second inverting stage is connected to said first power supply terminal, a first transistor connected to the first inverting stage such that said first transistor connects an output terminal of the level shifter and the high potential power supply terminal upon the fall of an output potential of the first inverting stage, and a second transistor connected to the second inverting stage such that said second transistor connects the output terminal of the level shifter and the low potential power supply terminal upon the rise of an output potential of the second inverting stage, the first inverting stage supplied with a current from the high potential power supply terminal upon the fall of the potential of the output terminal of the level shifter, wherein the first inverting stage is constituted by a third transistor with a gate electrode connected to the signal input terminal and a fifth/seventh transistor combination for supplying a current at the time of a fall of the potential of the output terminal of the level shifter, the third transistor and the fifth transistor being connected in series between the high potential power supply terminal and the second power supply terminal and the output terminal being constituted by the connection point of the third transistor and the fifth transistor, the fifth transistor with an input terminal connected to the output terminal of the level shifter and the seventh transistor with an input terminal connected to the signal input terminal, the fifth and seventh transistors being connected in series, and the second inverting stage supplied with a current from the low potential power supply terminal upon the rise of the potential of the output terminal of the level shifter, wherein the second inverting stage is constituted by a fourth transistor with a gate electrode connected to the signal input terminal and a sixth/eighth transistor combination for supplying the current at the time of a rise of the potential of the output terminal of the level shifter, the fourth transistor and the sixth transistor means being connected in series between the first supply terminal and the low potential power supply terminal and the output terminal being constituted by the connection of the fourth transistor and the sixth transistor, the sixth transistor with an input terminal connected to the output terminal of the level shifter and the eighth transistor with an input terminal connected to the signal input terminal, the sixth and eighth transistors being connected in series.

14. The level shifter of claim 13, wherein said signal input terminal is connected to an inverter.

15. A level shifter, comprising:

a first power supply terminal, a second power supply terminal, a signal input terminal supplied with an input signal, a high potential power supply terminal with a potential higher than the potential of the first power supply terminal, a low potential power supply terminal with a potential lower than the potential of the second power supply terminal, a first inverting stage and a second inverting stage connected to the signal input terminal, wherein said first inverting stage is connected to said second power supply terminal and said second inverting stage is connected to said first power supply terminal, a first transistor connected to the first inverting stage such that said first transistor connects an output terminal of the level shifter and the high potential power supply terminal upon the fall of an output potential of the first inverting stage, and a second transistor connected to the second inverting stage such that said second transistor connects the output terminal of the level shifter and the low potential power supply terminal upon the rise of an output potential of the second inverting stage, the first inverting stage supplied with a current from the high potential power supply terminal upon the fall of the potential of the output terminal of the level shifter, wherein the first inverting stage is constituted by a third transistor with a gate electrode connected to the signal input terminal and a fifth/seventh transistor combination for supplying a current at the time of a fall of the potential of the output terminal of the level shifter, the third transistor and the fifth transistor being connected in series between the high potential power supply terminal and the second power supply terminal and the output terminal being constituted by the connection point of the third transistor and the fifth transistor, the fifth transistor with an input terminal connected to the output terminal of the level shifter and the seventh transistor with an input terminal connected to the signal input terminal, the fifth and seventh transistors being connected in series, and the second inverting stage supplied with a current from the low potential power supply terminal upon the rise of the potential of the output terminal of the level shifter, wherein the second inverting stage is constituted by a fourth transistor with a gate electrode connected to the signal input terminal and a sixth/eighth transistor combination for supplying the current at the time of a rise of the potential of the output terminal of the level shifter, the fourth transistor and the sixth transistor means being connected in series between the first supply terminal and the low potential power supply terminal and the output terminal being constituted by the connection of the fourth transistor and the sixth transistor, the sixth transistor with an input terminal connected to the output terminal of the level shifter and the eighth transistor with an input terminal connected to the signal input terminal, the sixth and eighth transistors being connected in series, wherein the output of the first inverting stage is connected to one of the source-drain terminals of a ninth transistor which is cut-off by a voltage of the output terminal of the first inverting stage higher than the potential of the first power supply terminal, the output of the second inverting stage is connected to one of the source-drain terminals of a tenth transistor which is cut-off by a voltage of the output terminal of the second inverting stage lower than the potential of the second power supply terminal, and the other source-drain terminal of the ninth transistor and the other source-drain terminal of the tenth transistor are connected.

16. The level shifter of claim 15, wherein said signal input terminal is connected to an inverter.

17. A level shifter, comprising:

a first power supply terminal, a second power supply terminal, a signal input terminal supplied with an input signal, a high potential power supply terminal with a potential higher than the potential of the first power supply terminal, a low potential power supply terminal with a potential lower than the potential of the second power supply terminal, a first inverting stage and a second inverting stage connected to the signal input terminal, wherein said first inverting stage is connected to said second power supply terminal and said second inverting stage is connected to said first power supply terminal, a first transistor connecting an output terminal of the level shifter and the high potential power supply terminal upon the fall of an output potential of the first inverting stage, and a second transistor connecting the output terminal of the level shifter and the low potential power supply terminal upon the rise of an output potential of the second inverting stage, the first inverting stage supplied with a current form the high potential power supply terminal upon the fall of the potential of the output terminal of the level shifter, and the second inverting stage supplied with a current from the low potential power supply terminal upon the rise of the potential of the output terminal of the level shifter, wherein the output of the first inverting stage is connected to one of the source-drain terminals of a ninth transistor which is cut-off by a voltage of the output terminal of the first inverting stage higher than the potential of the first power supply terminal, the output of the second inverting stage is connected to one of the source-drain terminals of a tenth transistor which is cut-off by a voltage of the output terminal of the second inverting stage lower than the potential of the second power supply terminal, and the other source-drain terminal of ninth transistor and the other source-drain terminal of the tenth transistor are connected.

\* \* \* \* \*